United States Patent [19]

Schmidt

[11] 3,999,154
[45] Dec. 21, 1976

[54] NETWORK WITH SINGLE AMPLIFIER FOR SIMULATING FDNR CIRCUIT

[75] Inventor: Charles E. Schmidt, Woodside, Calif.

[73] Assignee: GTE Automatic Electric Laboratories Incorporated, Northlake, Ill.

[22] Filed: Dec. 24, 1975

[21] Appl. No.: 644,281

[52] U.S. Cl. .......................... 333/80 R; 333/80 T
[51] Int. Cl.$^2$ ........................................ H03H 7/44
[58] Field of Search ........................ 333/80 R, 80 T

[56] References Cited

UNITED STATES PATENTS

| | | | |
|---|---|---|---|
| 2,968,773 | 1/1961 | Sandberg | 333/80 T |
| 3,219,952 | 11/1965 | Saraga | 333/80 R |
| 3,831,117 | 8/1974 | Fletcher | 333/80 R |
| 3,895,309 | 7/1975 | Rollett et al. | 333/80 R |

Primary Examiner—Harold A. Dixon
Attorney, Agent, or Firm—Russell A. Cannon; Leonard R. Cool

[57] ABSTRACT

The one-port network here includes a pair of terminals and a single differential-input operational amplifier having an output electrically connected through the parallel combination of a resistor R3 and a capacitor C3 to a first input of the amplifier, through a resistor R4 to a second input of the amplifier, and through the series combination of the resistor R3 and a resistor R5 to one terminal of the network which is electrically connected to a ground reference potential. The second input of the amplifier is also connected to ground through a resistor R6. The first and second inputs of the amplifier are electrically connected through an associated capacitor C1 and resistor R2 to the other terminal of the network. With the capacitances of the two capacitors normalized to values of unity and with the initial constraint that the normalized conductance of the resistor R4 be equal to the sum of the normalized conductances of the resistors R2 and R6, the admittance presented across the network terminals corresponds to that of the parallel combination of an FDNR, a capacitor, and a resistor. With the additional constraint that the product of the normalized conductances of the resistors R3 and R6 be equal to the product of the normalized conductances of the resistors R4 and R5, the impedance presented across the network terminals corresponds to that of the parallel combination of an FDNR and a capacitor. With both the initial constraint and the alternate constraint that the product of the normalized conductances of the resistors R4 and R5 be equal to the sum of the product of the normalized conductances of the resistors R2 and R6 and the product of the normalized conductances of the resistors R3 and R6, the impedance simulated across the network terminals corresponds to that of the parallel combination of an FDNR and a frequency-independent negative resistance. The network impedance is converted to that of an ideal FDNR by connecting a resistor having an appropriate resistance across the network terminals.

10 Claims, 2 Drawing Figures

NETWORK WITH SINGLE AMPLIFIER FOR SIMULATING FDNR CIRCUIT

BACKGROUND OF THE INVENTION

This invention relates to simulation networks and more particularly to a network for simulating a frequency-dependent negative resistor (FDNR) alone or in parallel with a capacitor and/or a resistor.

In order to provide high-quality filters for use in integrated circuit applications, simulation networks are employed to replace filter inductors with other elements that can be fabricated with integrated circuit techniques. One method of realizing a lowpass inductor-capacitor-resistor (LCR) filter network is to use the concept of frequency-dependent negative resistors (FDNR), which are designated by the parameter D and a symbol represented by four parallel lines. An FDNR is a circuit element defined by its admittance Y which satisfies the relationship $Y(s) = s^2 D$, where $s$ is the complex frequency parameter and D is a real number which may be positive or negative. A prior-art lowpass ladder filter comrpises a pair of series inductors connected in series between input and output terminals, an inductor in series with a capacitor and connected between the junction of the series inductors and a ground reference potential, an output capacitor connected between the output terminal and ground, and input and output resistors connected between the input and output terminals, respectively, and ground. The voltage transfer function of this filter is unchanged if the filter is transformed to an equivalent network by multiplying the admittance of every element by the complex frequency parameter $s = j\omega$ so that an inductor becomes a resistor, a resistor becomes a capacitor, and a capacitor becomes an FDNR in the transformed equivalent network in accordance with the technique described in the article, "Network Transfer Functions Using the Concept of Frequency-Dependent Negative Resistance" by L. T. Bruton, IEEE Transactions on Circuit Theory, Aug. 1969, pp. 406 – 408. The resultant equivalent network includes an FDNR, the series combination of an FDNR and a resistor, and the parallel combination of an FDNR and a capacitor. Prior-art circuits for simulating an FDNR singularly or in combination with other elements are relatively complex and generally employ two or more amplifiers. Although the structure disclosed in the article, "Parallel Resonator with a Resistance and a Frequency-Dependent Negative Resistance Realized with a Single Operational Amplifier" by Francesco Molo, IEEE Transactions on Circuits and Systems, vol. CAS-21, no. 6, November 1974, pp. 783 – 788, employs only one amplifier, the circuit there has a finite Q in that the reactance of the network cannot be adjusted to zero at a particular frequency. Also, the circuit in this article does not simulate an FDNR alone, and requires three capacitors in the simulation network as opposed to the usual two capacitors.

An object of this invention is the provision of an improved circuit for realizing an FDNR singularly or in parallel combination with a resistor and/or a capacitor.

DESCRIPTION OF DRAWING

This invention will be more fully understood from the following detailed descriptions of preferred embodiments thereof, reference being had to the drawing in which.

DESCRIPTION OF PREFERRED EMBODIMENTS

Figure 1:
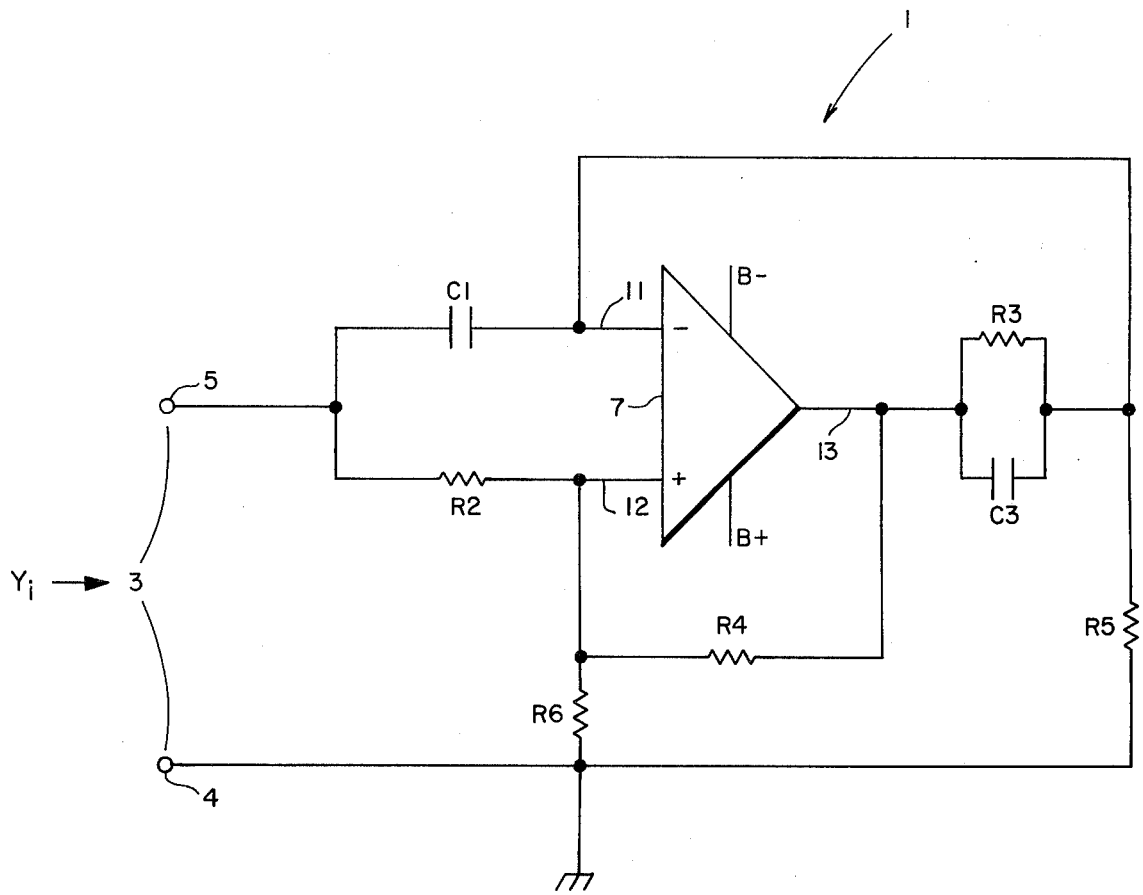
FIG. 1 is a schematic circuit diagram of a simulation network embodying this invention.

The network 1 in FIG. 1 comprises a single port 3 including a pair of terminals 4 and 5, a single amplifier 7, a pair of capacitors C1 and C3, and a plurality of resistors R2 – R6, inclusive. The same reference character (e.g., R5) is employed in this description to designate both the element and the element value (e.g., the resistance thereof). The context in which a reference character is employed clearly indicates what it designates.

The amplifier 7 is a differential-input operational amplifier. This amplifier 7 is considered in the following description to be an ideal amplifier with zero output impedance, infinite input impedance, and infinite voltage gain. Although such an ideal amplifier does not exist in practice, this does not seriously affect the operation of network 1. A non-ideal amplifier 7 merely introduces extraneous terms in the admittance $Y_t$ that is simulated across the network terminals 4 and 5 which can be compensated for, in a manner well known in the art, in order to produce the desired admittance across port 3.

One of the network terminals 4 is connected to a ground reference potential. The input lines 11 and 12 to amplifier 7 are connected through the capacitor C1 and resistor R2, respectively, to the other input terminal 5. The lines 11 and 12 are shown here as being connected to the negative and positive inputs, respectively, of amplifier 7. The actual polarity of the connections is selected to ensure that the network is DC stable. This is accomplished by making the negative feedback here greater than the positive feedback in a manner well known in the art. This connection may also be affected by whatever resistance path is connected across the terminals 4 and 5. Terminals of the amplifier are also connected to a supply voltage in a manner well known in the art. The output line 13 of the amplifier 7 is connected through the parallel combination of the resistor R3 and capacitor C3 to one input line 11, through the resistor R4 to the other input line 12, and through the series combination of resistors R3 and R5 to the ground reference potential. The input line 12 is also electrically connected to ground through the resistor R6.

Consider that the values of capacitance and resistance for the elements in the network are normalized and expressed in farads and ohms, respectively. Solving the node equations for the network in FIG. 1 and requiring that values of the conductance $g$ of elements thereof satisfy the relationship $$g4 = g2 + g6, \qquad \qquad 1.$$

the admittance $Y_t$ looking into port 3 is representable as $$Y_t = s^2 D + sC + G \qquad \qquad (2)$$

$$= s^2 \left( \frac{g6}{g2\,g3 + g3\,g6 - g4\,g5} \right) + s \left( \frac{g2\,g6 + g3\,g6 - g4\,g5}{g2\,g3 + g3\,g6 - g4\,g5} \right)$$

$$+ \frac{g2(g3\,g6 - g4\,g5)}{g2\,g3 + g3\,g6 - g4\,g5}. \tag{3}$$

Figure 2:
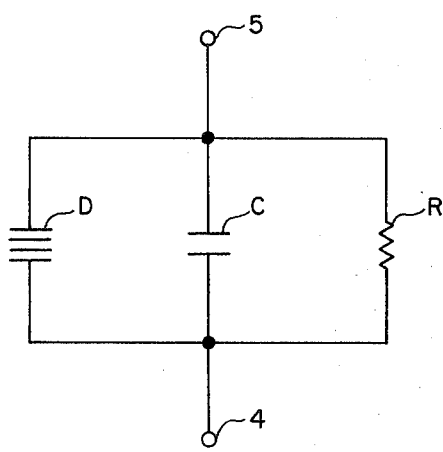
FIG. 2 is a schematic representation of the circuit elements simulated by the network in FIG. 1 across the one port thereof.

This admittance $Y_t$ is shown in FIG. 2 and corresponds to the parallel combination of an FDNR D, a capacitor C, and a resistor R = 1G electrically connected between the network terminals 4 and 5. By proper choice of the resistances R2 – R6, either the simulated capacitor C or the simulated resistor R can be made to vanish. Also, the resistances R2 – R6 may be selected to simulate the parallel combination of a capacitor and an FDNR or a resistor and an FDNR. Further, the values of the simulated elements may be made to be positive or negative, within the constraints implied by equations (4), (5) and (6) supra and allowing for the connection of an additional positive resistor between terminals 4 and 5 of FIG. 1.

In order to simulate the parallel combination of a particular resistor, capacitor, and FDNR across port 3, the resistances R2 – R6 are selected to satisfy the requirement in equation (1) and the relationship for the simulated R, C, and D in equations (2) and (3). The capacitors C1 and C3 both have normalized capacitances of one farad. In practice, desired values of the simulated resistor R, capacitor C, and FDNR D are selected to provide a particular admittance $Y_t$. Normalized values of the resistances R2 – R6 are also selected so as to satisfy equations (1) – (3) for the previously selected values for R, C, and D. Finally, normalized values of the elements R2 – R6, C1, and C3 are de-normalized to values for the corresponding elements which are physically realizable and convenient for use in an actual circuit. More specifically, e.g., the filter network is denormalized for a desired capacitance $C_0 = 10^{-8}$ farads and desired frequency shift of 1 radian per second = 1 kHz by multiplying all capacitors by $C_0$ and all resistors by $R_0 = \frac{1}{2\pi f C_0} = 15.92$ Kohms to obtain values of network elements. By way of example, the parallel combination of a resistor R, capacitor C, and FDNR D is simulated across port 3 if the element values satisfy the definitions:

$$g2 = g6 = g4/2 = C/2D \pm ((C/2D)^2 - G/D)^{1/2} \tag{4}$$

$$g3 = g2 + (1 - C)/D, \tag{5}$$

$$g5 = g2 + (1 - 2C)/2D. \tag{6}$$

In an alternate embodiment of this invention, the conductances of elements here are further required to satisfy the relationship $$g3\,g6 = g4\,g5 \tag{7}$$

such that the admittance $Y_t$ becomes $$Y_t = s^2 D + sC \tag{8}$$

$$= s^2 \frac{g6}{g2\,g3} + s \frac{g6}{g3}. \tag{9}$$

This admittance defined by equations (8) and (9) indicates that the network now simulates the parallel combination of an FDNR D and capacitor C across port 3. Such a combination of simulated elements is particularly useful at one end of an FDNR lowpass filter of even degree and at the termination of many bandpass filters. By way of example, one possible set of element values for simulating the parallel combination of only a capcitor C and FDNR D across port 3 is:

$$g2 = g6 = g4/2 = C/D \tag{10}$$

and $$g3 = 2g5 = 1/D. \tag{11}$$

In another alternate embodiment of this invention, the conductances of resistors R2 – R6 in FIG. 1 are required to satisfy the relationship in equation (1) and additionally that $$g4\,g5 = g2\,g6 + g3\,g6 \tag{12}$$

such that the admittance $Y_t$ becomes $$Y_t = s^2 D - G \tag{13}$$

$$= s^2 \frac{g6}{g2(g3 - g6)} - \frac{g2\,g6}{g3 - g6}. \tag{14}$$

This admittance defined by equations (13) and (14) indicates that the network in FIG. 1 which satisfies the requirements of equations (1) and (12) simulates the parallel combination of an FDNR D and a frequency-independent negative resistance (-R) across port 3. By way of example, one possible set of element values for simulating the parallel combination of an FDNR and a negative resistance across port 3 is $$g2 = g6 = g4/2 = (G/D)^{1/2}, \tag{15}$$

$$g3 = g2 + 1/D, \tag{16}$$

and $$g5 = g2 + \tfrac{1}{2}D. \tag{17}$$

As stated previously, when the conductances of elements in FIG. 1 satisfy the requirements of equations (1) and (12), the network simulates the parallel combination of an FDNR D and a negative resistance -R across port 3. In a modified form of this embodiment of the invention, a conventional resistor (not shown) having a positive resistance +$R_c$ is connected across the terminals 4 and 5. This modified network is caused to simulate only an ideal FDNR, except for any possible non-ideal properties of the amplifier, across port 3 by requiring the absolute values of the simulated conductane —G in equations (13) and (14) to be equal to the absolute value of the conductance $1R_c$ of the conventional resistor. Alternatively, this network is caused to simulate the parallel combination of an FDNR and a positive resistance across port 3 by causing the absolute value of the conductance $1R_c$ of the conventional resistor to be greater than the absolute value of the conductance $-G$ simulated by the remainder of the network.

What is claimed is:

1. An active one-port network for simulating the parallel combination of an FDNR D, a capacitor C, and a resistor R electrically connected in series across the pair of terminals of the network port, comprising:

a differential-input operational amplifier having first and second input lines electrically connected to associated input terminals of the amplifier which are of opposite polarity and having an output line;

a capacitor C1 electrically connected between one network terminal and said first input line;

a resistor R2 electrically connected between the one terminal and said second input line;

the parallel combination of a resistor R3 and capacitor C3 electrically connected between said output line and said first input line;

a resistor R4 electrically connected in series between said output line and said second input line;

a resistor R5 electrically connected between said first input line and the other network terminal which is also connected to a ground reference potential; and a resistor R6 electrically connected between said second input line and ground;

normalized values of the capacitances of said capacitors being unity;

normalized values of the resistances of said resistors satisfying the requirement that $$g4 = g2 + g6,$$

where $g$ represents the conductance of a particular one of said resistors, the admittance $Y_i$ looking into the network port satisfying the relationships $$Y_i = s^2D + sC + G$$

$$= s^2 \left( \frac{g6}{g2\,g3 + g3\,g6 - g4\,g5} \right) +$$

$$s \left( \frac{g2\,g6 + g3\,g6 - g4\,g5}{g2\,g3 + g3\,g6 - g4\,g5} \right)$$

$$+ \frac{g2(g3\,g6 - g4\,g5)}{g2\,g3 + g3\,g6 - g4\,g5}$$

where the symbols D, C, and 1/G represent the values of the FDNR, capacitor, and resistor, respectively, simulated across the network port.

2. The simulation network according to claim 1 including only a single amplifier.

3. The simulation network according to claim 2 wherein the conductances of said resistors satisfy the additional requirement that $$g3\,g6 = g4\,g5,$$

the admittance $Y_i$ across the network port now satisfying the relationship $$Y_i = s^2D + sC + G$$

where $D = g6/g2\,g3$; $C = g6/g3$; and $G = O$, this latter relationship for $Y_i$ defining the parallel combination of an FDNR D and a capacitor C simulated across the network port.

4. The simulation network according to claim 3 wherein the conductances of said resistors satisfy the requirements that $g2 = g6 = g4/2 = CD$ and $g3 = 2g5 = 1/D$.

5. The simulation network according to claim 2 wherein the conductances of said resistors satisfy the additional requirement that $$g4\,g5 = g2\,g6 + g3\,g6,$$

the admittance $Y_i$ across the network port now satisfying the relationship $$Y_i = s^2D + sC + G$$

where $D = g6/(g2(g3 - g6)); C = O$ and $G = g2\,g6/(g3 - g6)$, this latter relationship for $Y_i$ defining the parallel combination of an FDNR D and a resistor R simulated across said network port, said simulated resistor having negative values of resistance and conductance.

6. The simulation network according to claim 5 wherein the conductances of said resistors satisfy the requirements that $g2 = g6 = g4/2 = (G/D)^{1/2}$; $g3 = g2 + 1/D$ and $g5 = g2 + \frac{1}{2}D$.

7. The simulation network according to claim 5 including only two capacitors.

8. The simulation network according to claim 5 including a resistor R7 having a positive resistance electrically connected across the network port.

9. The simulation network according to claim 8 wherein the conductance of said resistor R7 satisfies the relationship $$|g7| = |g2\,g6/(g3 - g6)|,$$

the network now simulating an FDNR alone across the network port.

10. The simulation network according to claim 8 wherein the conductance of said resistor R7 is greater than $|g2\,g6(g3 - g6)|$, where the values of $g2$, $g3$, and $g6$ are positive, the network now simulating the parallel combination of an FDNR and a resistor having a positive resistance across the network port.

* * * * *

UNITED STATES PATENT AND TRADEMARK OFFICE
CERTIFICATE OF CORRECTION

PATENT NO. : 3,999,154
DATED : December 21, 1976
INVENTOR(S) : Charles E. Schmidt It is certified that error appears in the above-identified patent and that said Letters Patent are hereby corrected as shown below:

Column 3, line 12, "R = 1G" should read -- R = 1/G --.

Column 4, line 16, "capcitor" should read -- capacitor --.

Column 5, line 1, "$1R_c$" should read -- $1/R_c$ --.

Column 6, line 17, claim 4, "= CD" should read -- = C/D --.

Column 6, line 30, claim 5, insert another closing parenthesis before the semicolon; and same line 30, immediately following the equal sign (third occurrence) "g2" should read -- -g2 --.

Column 6, line 52, claim 10, "|g2 g6(g3 - g6)| should read -- |g2 g6/(g3 - g6)| --.

Signed and Sealed this

Tenth Day of May 1977

[SEAL]

Attest:

RUTH C. MASON
Attesting Officer

C. MARSHALL DANN
Commissioner of Patents and Trademarks